US009484102B2

(12) United States Patent
Oh et al.

(10) Patent No.: US 9,484,102 B2
(45) Date of Patent: Nov. 1, 2016

(54) SEMICONDUCTOR DEVICE AND METHOD OF OPERATING THE SAME

(71) Applicant: SK hynix Inc., Gyeonggi-do (KR)

(72) Inventors: Dong Yean Oh, Seoul (KR); Eun Mee Kwon, Gyeonggi-do (KR); Bong Hoon Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/674,806

(22) Filed: Mar. 31, 2015

(65) Prior Publication Data

US 2016/0133328 A1    May 12, 2016

(30) Foreign Application Priority Data

Nov. 10, 2014  (KR) .................... 10-2014-0155295

(51) Int. Cl.
    *G11C 16/06*   (2006.01)
    *G11C 16/14*   (2006.01)
    *G11C 16/34*   (2006.01)
    *G11C 11/56*   (2006.01)
    *G11C 13/00*   (2006.01)
    *G11C 16/10*   (2006.01)
    *G11C 16/04*   (2006.01)

(52) U.S. Cl.
    CPC .......... *G11C 16/14* (2013.01); *G11C 11/5621* (2013.01); *G11C 11/5628* (2013.01); *G11C 11/5635* (2013.01); *G11C 11/5671* (2013.01); *G11C 11/5678* (2013.01); *G11C 13/0004* (2013.01); *G11C 13/0064* (2013.01); *G11C 13/0069* (2013.01); *G11C 13/0097* (2013.01); *G11C 16/10* (2013.01); *G11C 16/3459* (2013.01); *G11C 16/0483* (2013.01); *G11C 2013/0073* (2013.01)

(58) Field of Classification Search
    CPC .......... G11C 16/0483; G11C 16/3418; G11C 11/5642; G11C 11/5628; G11C 16/0416; G11C 2211/5621; G11C 16/12; G11C 16/3454; G11C 16/3445; G11C 16/3468; G11C 16/10; G11C 16/3459; G11C 14/00; G11C 14/0018
    USPC ............ 365/185.17, 185.22, 185.24, 185.02, 365/185.28, 185.11, 230.03, 185.19, 365/185.29, 63
    See application file for complete search history.

(56) References Cited

U.S. PATENT DOCUMENTS

2012/0092931 A1* 4/2012 Edahiro ............. G11C 16/3459
                                                      365/185.17
2015/0380427 A1* 12/2015 Sasaki ............... H01L 27/11582
                                                      257/324

FOREIGN PATENT DOCUMENTS

| KR | 100919891 | 9/2009 |
| KR | 1020130092860 | 8/2013 |
| KR | 1020130104590 | 9/2013 |

* cited by examiner

*Primary Examiner* — Thong Q Le
(74) *Attorney, Agent, or Firm* — IP & T Group LLP (57) ABSTRACT

A method of operating the semiconductor device includes performing an erase operation on a plurality of memory cells, performing a back-tunneling operation by injecting electrons into a storage node from a gate electrode of a memory cell, selected among the plurality of memory cells, and performing a program operation by injecting electrons into the storage node from a channel layer of the selected memory cell.

12 Claims, 9 Drawing Sheets

SEMICONDUCTOR DEVICE AND METHOD OF OPERATING THE SAME

CROSS-REFERENCE TO RELATED APPLICATION

The present application claims priority to Korean patent application number 10-2014-0155295, filed on Nov. 10, 2014, the entire disclosure of which is incorporated herein in Its entirety by reference.

BACKGROUND

1. Field of Invention

The present invention relates to a semiconductor device and a method of operating the same. More specifically, the present invention relates to a semiconductor device and a method of programming the semiconductor device bi-directionally.

2. Discussion of Related Art

Semiconductor devices are embodied using semiconductor materials including silicon, germanium, as well as others. The main categories of semiconductor devices are volatile memory devices and nonvolatile memory devices.

When a supply of electric power is cut off, data stored in a volatile memory device is lost. However, when the supply of electric power is cut off in a nonvolatile memory device, data is maintained.

Nonvolatile memory devices include a plurality of memory cells configured to store data, and each of the memory cells includes a storage node that stores charges. However, when a program operation is performed after an erase operation, holes exist in the storage node and, thus, programmed data may be damaged or lost.

SUMMARY

The present invention is directed to a semiconductor device having improved data retention characteristics, and a method of operating the same.

One aspect of the present invention provides a method of operating a semiconductor device including performing an erase operation on a plurality of memory cells, performing a back-tunneling operation by injecting electrons into a storage node from a gate electrode of a memory cell selected among the plurality of memory cells, and performing a program operation by injecting electrons into the storage node from a channel layer of the selected memory cell.

Another aspect of the present invention provides a method of performing a bidirectional program operation on a semiconductor device including performing an erase operation on a plurality of memory cells, applying a negative back-tunneling voltage to a word line connected to a memory cell selected from the plurality of memory cells, and applying a positive program voltage to the word line connected to the selected memory cell.

Another aspect of the present invention provides a semiconductor device including a cell array including a plurality of memory cells, and a control circuit suitable for performing a program operation on the cell array, wherein the control circuit performs the program operation on a memory cell selected from the plurality of memory cells by applying a negative back-tunneling voltage to a word line connected to the selected memory cell and applying a positive program voltage to the word line, after performing an erase operation on the plurality of memory cells.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Hereinafter, exemplary embodiments of the present invention will be explained. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the thicknesses of layers and regions are expressed for convenience of the explanation, and may be exaggerated with respect to actual physical thickness. In the explanation of the present invention, well known structures, which are not central to the novelty of present invention, may be omitted. In numbering reference numerals to the structural parts of each drawing, like numerals may refer to like elements throughout the descriptions of the figures although the reference numerals are displayed in different drawings.

Figure 1:
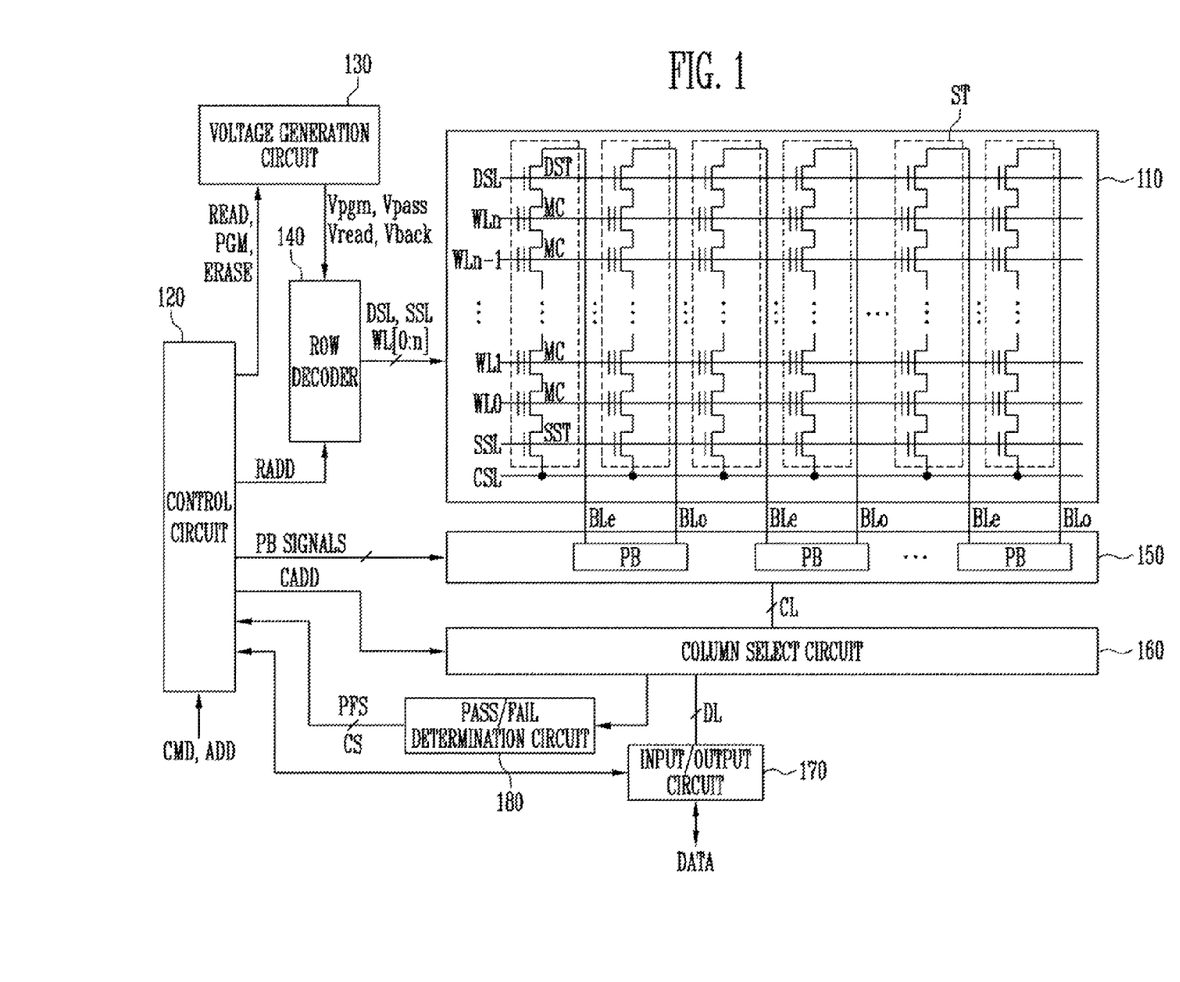
FIG. 1 is a view illustrating a configuration of a semiconductor device according to an embodiment of the present invention.

FIG. 1 is a view illustrating a configuration of a semiconductor device according to an embodiment of the present invention.

Referring to FIG. 1, the semiconductor device according to an embodiment of the present invention includes a cell array 110, circuits 130, 140, 150, 160, 170, and 180 configured to perform a program operation or a read operation on memory cells included in the cell array 110, and a control circuit 120 configured to control the circuits 130, 140, 150, 160, 170, and 180. The circuits may include a voltage generation circuit 130, a row decoder 140, a page buffer group 150, a column select circuit 160, an input/output circuit 170, and a pass/fail determination circuit 180.

The cell array 110 may include a plurality of memory cell blocks, and one memory cell block thereamong is described in FIG. 1. The memory cell block may include a plurality of strings ST. The strings ST may be horizontally arranged, or vertically arranged on a substrate. For example, when the strings ST are arranged in a linear shape on the substrate, each of the strings ST includes at least one source select transistor SST, a plurality of memory cells MC, and at least one drain select transistor DST, which are connected in series. In another embodiment, when the strings ST are arranged in a U shape on the substrate, each of the strings ST includes at least one source select transistor SST, a plurality of source memory cells MC, a pipe transistor, a plurality of drain memory cells MC, and at least one drain select transistor DST. Here, the source select transistor SST is connected to a common source line CSL, and the drain select transistor DST is connected to a bit line BLo or BLe. Also, a gate electrode of the source select transistor SST is connected to a source select line SSL, and gate electrodes of the memory cells MC are connected to word lines WL0 to WLn, and a gate electrode of the drain select transistor DST is connected to a drain select line DSL.

The control circuit 120 may output a program operation signal PGM, a read operation signal READ, or an erase operation signal ERASE in response to a command signal CMD, and output page buffer signals PB SIGNALS for controlling page buffers PB included in the page buffer group 150 based on types of operations. The control circuit 120 may output a row address signal RADD and a column address signal CADD in response to an address signal ADD. The control circuit 120 may check whether threshold voltages of selected memory cells MC are increased to a desired voltage based on a check signal CS, which is outputted from the pass/fail determination circuit 180 when a program verification operation is performed, and determine another performance of the program operation or completion thereof based on a result of the check.

Voltage supply circuits may supply voltages required for a program operation, an erase operation, or a read operation on the memory cells MC to the drain select line DSL, the word lines WL0 to WLn, and the source select line SSL based on signals READ, PGM, ERASE, and RADD of the control circuit 120. The above voltage supply circuits may include the voltage generation circuit 130 and the row decoder 140.

The voltage generation circuit 130 outputs operating voltages to program, read, or erase the memory cells MC to global lines in response to operation signals PGM, READ, and ERASE which are internal command signals of the control circuit 120. For example, the operating voltages such as a program voltage Vpgm, a pass voltage Vpass, a verification voltage Vread, a back-tunneling voltage Vback, and/or the like to program the memory cells MC may be outputted to the global lines.

The row decoder 140 may transmit the operating voltages generated in the voltage generation circuit 130 to local lines DSL, WL[0:n], and SSL of a selected memory cell block in response to the row address signal RADD.

The page buffer group 150 may include page buffers PB respectively connected to the bit lines BLo and BLe. The page buffer group 150 may apply voltages required to store data in the memory cells MC to the bit lines BLo and BLe in response to the page buffer signals PB SIGNALS outputted from the control circuit 120. In particular, the page buffer group 150 may precharge the bit lines BLo and BLe or latch data corresponding to a threshold voltage level of the memory cells MC based on voltage variations of the bit lines BLo and BLe, when the program operation, the erase operation, or the read operation of the memory cells MC are performed. That is, the page buffer group 150 may apply a program permission voltage (for example, 0 V, 0+a V) or a program prohibition voltage (for example, Vcc) to the bit lines BLo and BLe based on data inputted to a latch during the program operation, and detect data stored in the memory cells MC by controlling voltages of the bit lines BLo and BLe based on the data stored in the memory cells MC during the read operation.

The column select circuit 160 may select page buffers PB included in the page buffer group 150 in response to the column address signal CADD outputted from the control circuit 120. Thus, data latched in a page buffer PB selected by the column select circuit 160 may be outputted. Also, the column select circuit 160 may receive data outputted from the page buffer group 150 through a column line CL, and transmit the data to the pass/fail determination circuit 180.

To input data DATA from outside to the page buffers PB of the page buffer group 150 when the program operation is performed, the input/output circuit 170 may transmit the data DATA to the column select circuit 160 based on control of the control circuit 120. When the column select circuit 160 sequentially transmits the transmitted data to the page buffers PB of the page buffer group 150, the page buffers PB may store the transmitted data in an internal latch. Also, during the read operation, the input/output circuit 170 may output data DATA transmitted from the page buffers PB of the page buffer group 150 through the column select circuit 160 to the outside.

The pass/fail determination circuit 180 may determine whether the program operation is complete, and output the result thereof as a check signal PFS. Also, the pass/fail determination circuit 180 may perform a function of counting the number of memory cells in which an error occurs, and outputting the result of the counting as a counting signal CS.

When the program operation of the memory cells MC is performed, the control circuit 120 may control the voltage generation circuit 130 to control the levels of operating voltages such as the back-tunneling voltage Vback, the program voltage Vpgm, the verification voltage Vread, and/or the like, and apply the operating voltage to the selected word line WL. The control circuit 120 may control the voltage generation circuit 130 based on the check signal CS of the pass/fail determination circuit 180.

For example, the control circuit 120, when the program operation is performed, performs an erase operation on the plurality of memory cells MC, and controls the voltage generation circuit 130, the row decoder 140, and/or the like so that a negative back-tunneling voltage Vback is applied to the selected word line WL, and then, a positive program voltage Vpgm is applied thereto. In particular, when the back-tunneling voltage Vback is applied, a negative back-tunneling voltage Vback, which has a gradually decreasing level, and a verification voltage Vread, which has a fixed value, may be alternately applied. Also, when the program voltage Vpgm is applied, a positive program voltage, which has a gradually increasing level, and a verification voltage Vread, which has a fixed value, may be alternately applied.

Figure 2A:
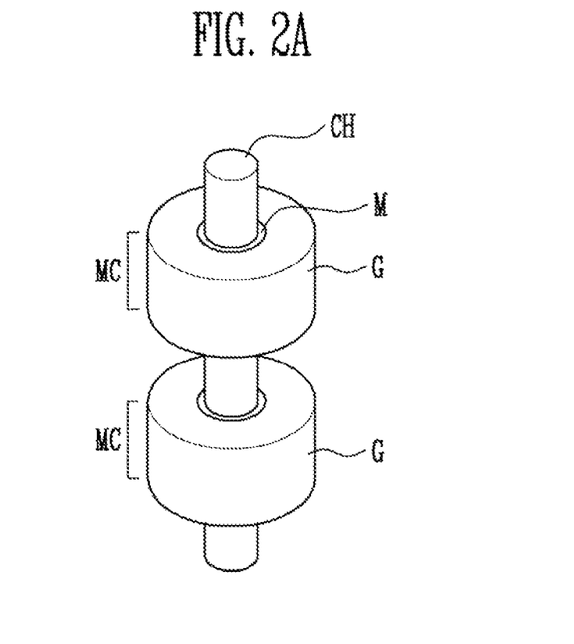
FIGS. 2A and 2B are a perspective view and a cross-sectional view illustrating a structure of a memory cell of the semiconductor device according to an embodiment of the present invention.
Figure 2B:
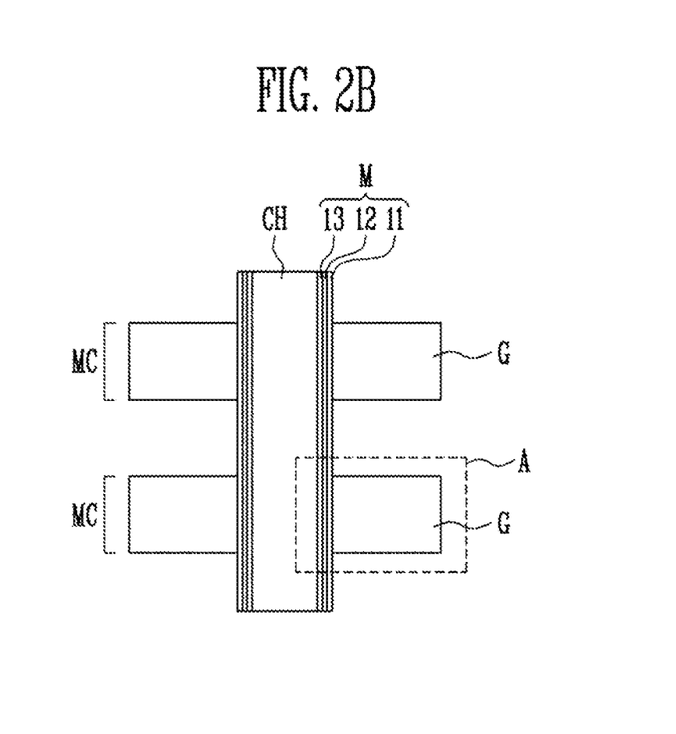

FIGS. 2A and 26 are a perspective view and a cross-sectional view illustrating a structure of a memory cell of the semiconductor device according to an embodiment of the present invention.

Referring to FIGS. 2A and 2B, the semiconductor device according to the embodiment of the present invention includes gate electrodes G which are stacked, a channel layer CH which passes through the gate electrodes G, and a memory layer M interposed between the channel layer CH and the gate electrodes G.

The gate electrodes G may include polysilicon, tungsten (W), tungsten nitride (WNx), titanium (Ti), tantalum (Ta), titanium nitride (TIN), tantalum nitride (TaN), and/or the like. The channel layer CH may include polysilicon, germanium (Ge), silicon germanium (SiGe), and/or the like. For example, the channel layer CH may be formed to have a completely filled center, a center filled with an insulating layer, or a combination thereof. Also, the memory layer M includes a tunnel insulating layer 13, a storage node 12, and a charge blocking layer 11. Here, the storage node 12 may include silicon, a nitride, a nanodot, a phase-change material, and/or the like.

According to the above-mentioned structure, the channel layer CH is formed in a pillar shape, and the gate electrodes G are formed to surround a sidewall of the channel layer CH. Thus, each of the memory cells MC is in a gate all-around structure. Also, adjacent memory cells MC may share the memory layer M, in particular, the storage node 12.

FIGS. 3A to 3D illustrate a method of operating semiconductor device according to an embodiment of the present invention, and are enlarged cross-sectional views illustrating portion A shown in FIG. 2B.

Each of memory cells MC includes a channel layer 31, a gate electrode 35, and a storage node 33 interposed between the channel layer 31 and the gate electrode 35. Also, a charge block layer 34 is interposed between the gate electrode 35 and the storage node 33, and a tunnel insulating layer 32 is interposed between the channel layer 31 and the storage node 33. Hereinafter, referring to FIGS. 3A to 3D, the operating method will be explained.

Figure 3A:
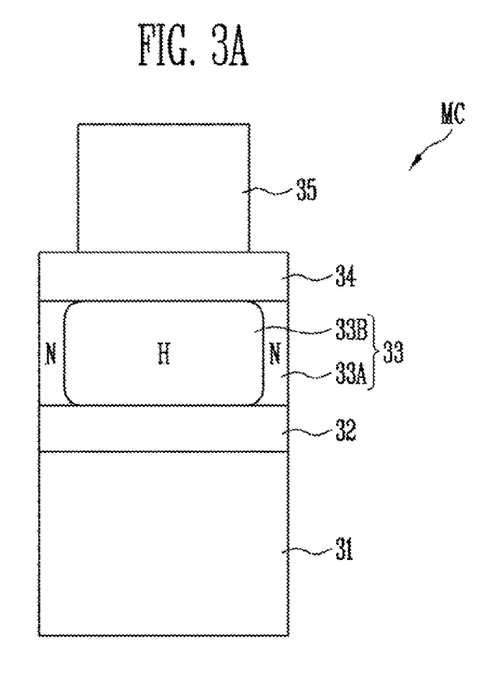
FIGS. 3A to 3D are views illustrating a method of operating a semiconductor device according to an embodiment of the present invention.

Referring to FIG. 3A, holes H are injected into the storage node 33 of the memory cells MC. For example, a positive erase voltage Vers is applied to the channel layer 31 and the gate electrode 35 grounded, or the channel layer 31 is grounded and a negative erase voltage Vers is applied to the gate electrode 35. Thus, electrons in the storage node 33 are discharged toward the channel layer 31, and thus, holes H are filled in the storage node 33.

In this case, the holes H are mainly filled in an overlap area of the storage node 33 with the gate electrode 35, and the other area of the storage node 33 maintains a neutral state. Thus, the storage node 33 includes a neutral area 33A and a positive area 33B in which the holes H are filled.

Figure 3B:
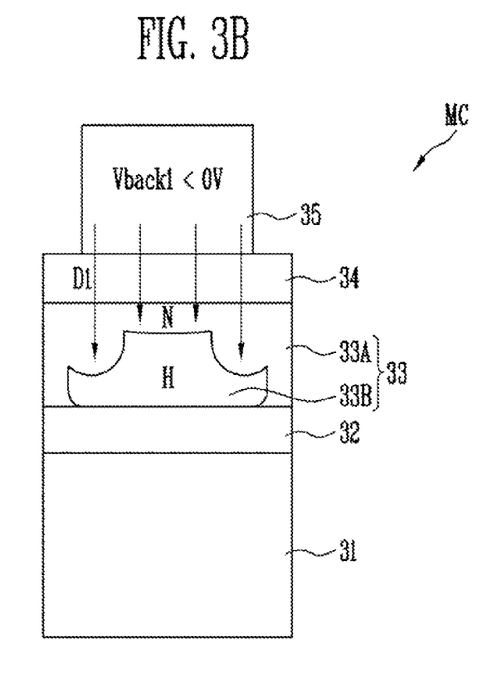

Referring to FIG. 3B, electrons are injected into the storage node 33 from a gate electrode 35 of a selected memory cell MC. For example, a first negative back-tunneling voltage Vback1 is applied to the gate electrode 35 of the selected memory cell MC and the channel layer 31 is grounded, and electrons are injected into the storage node 33 from the gate electrode 35. In order to induce back-tunneling between the gate electrode 35 and the channel layer 31, and a predetermined voltage may be applied to the channel layer 31. Here, a level of the first back-tunneling voltage Vback1 and a time T1 during which the first back-tunneling voltage Vback1 is applied is determined to be sufficient enough to remove holes H in an edge area of the storage node 33 adjacent to the gate electrode 35. For example, the level of the first back-tunneling voltage Vback1 and the time T1, during which the first back-tunneling voltage Vback1 is applied, is determined so that the same number of electrons E as the holes H in the edge area are injected. In this case, electrons are injected in a first direction D1, and the injected electrons are recombined with the holes H in the edge area of the storage node 33 adjacent to the gate electrode G. Thus, the edge area is neutralized (N), and the neutral area 33A expands.

Also, in a structure of the memory cell MC, a peripheral area of the gate electrode 35 has electric field intensity that is greater than a central area thereof. Thus, a relatively large number of electrons tunnel from the peripheral area of the gate electrode 35 to the storage node 33, and thus, an area of the storage node 33 corresponding to a periphery of the gate electrode 35 may be relatively neutral.

Figure 3C:
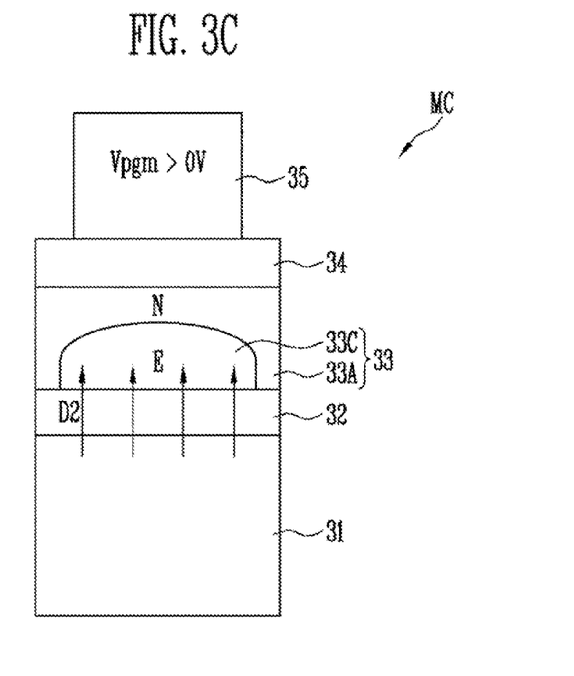
Figure 3D:
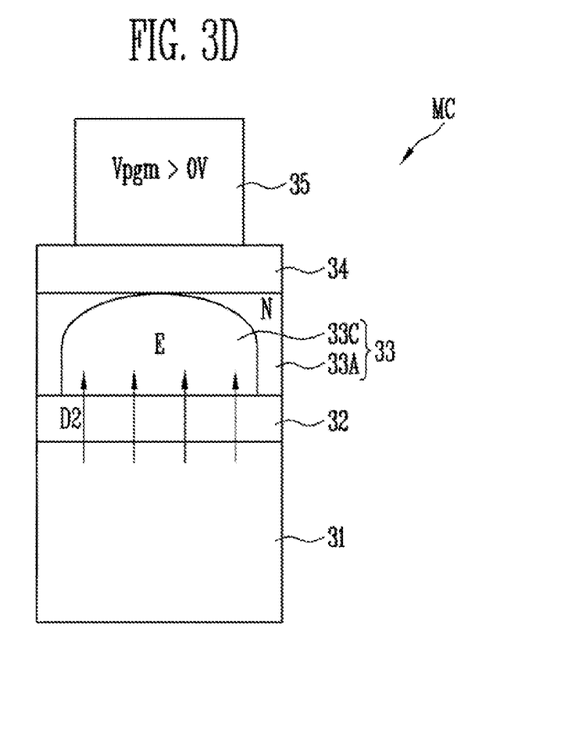

Referring to FIGS. 3C and 3D, electrons are injected to the storage node 33 of the selected memory cell MC from the channel layer 31. For example, a positive program voltage Vpgm, which has a gradually increasing level, is sequentially applied to the gate electrode 35 of the selected memory cell MC. In this case, since the electrons are injected in a second direction D2, an area of the storage node 33 adjacent to the channel layer 31 is gradually filled with electrons E. Thus, as the program voltage Vpgm is repeatedly applied, the edge area of the storage node 33, adjacent to the gate electrode G, is filled with the electrons E as well. Thus, the storage node 33 includes the neutral area 33A and a negative area 33B filled with the electrons E. Also, as the program operation is repeated, the negative area 33B expands toward an edge area adjacent to the gate electrode 35.

According to the above-mentioned operating method, the program operation is bi-directionally performed based on the storage node 33. The electrons are injected into the storage node 33 in the first direction D1 using the first negative back-tunneling voltage Vback, and then, the electrons are injected into the storage node 33 in the second direction D2 using the positive program voltage Vpgm. Thus, the first back-tunneling voltage Vback1 is applied during a first time T1, and the edge area of the storage node 33 is neutralized, and then, the program operation is performed, and thus, data retention characteristics may improve.

FIGS. 4A to 4D illustrate a method of operating semiconductor device according to another embodiment of the present invention, and are enlarged cross-sectional views illustrating area A shown in FIG. 2B.

Figure 4A:
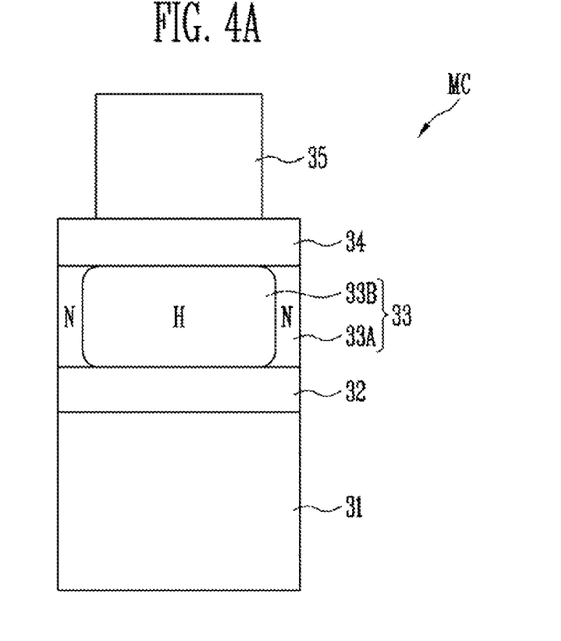
FIGS. 4A to 4D are views illustrating a method of operating a semiconductor device according to another embodiment of the present invention.

Referring to FIG. 4A, holes H are injected into a storage node 33 of a plurality of memory cells MC. For example, a positive erase voltage Vers is applied to a channel layer 31 and a gate electrode 35 is grounded, or the channel layer 31 is grounded and a negative erase voltage Vers is applied to the gate electrode 35.

In this case, holes H are generally filled in an overlap area of the storage node 33 with the gate electrode 35, and the other area of the storage node 33 maintains a neutral state. Thus, the storage node 33 includes a neutral area 33A and a positive area 33B in which the holes H are filled.

Figure 4B:
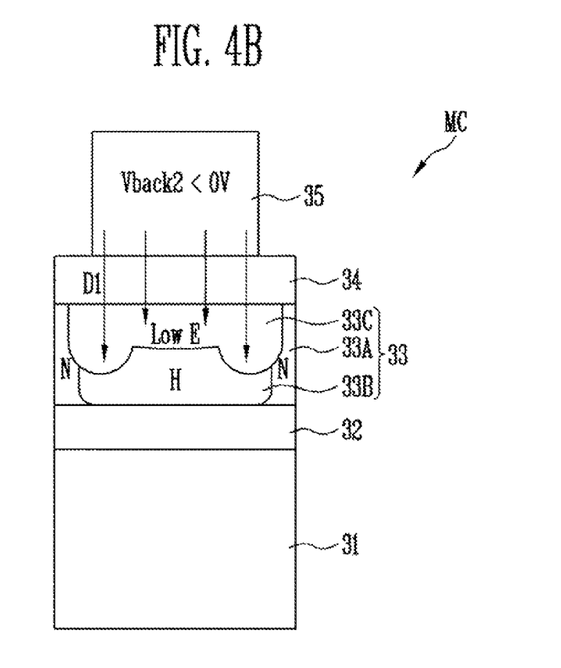

Referring to FIG. 48, electrons are injected into the storage node 33 from a gate electrode 35 of a selected memory cell MC. For example, a second negative back-tunneling voltage Vback2 is applied to the gate electrode 35 of the selected memory cell MC and the channel layer 31 is grounded, and thus, electrons are injected into the storage node 33 from the gate electrode 35.

Here, a level of the second back-tunneling voltage Vback2 and a time T2 during which the second back-tunneling voltage Vback2 Is applied is determined to be sufficient enough to remove holes H in an edge area of the storage node 33 adjacent to the gate electrode 35. For example, when holes H in the edge area are removed by filling the edge area with a low concentration of electrons, the level of the second back-tunneling voltage Vback2 and the time T2, during which the second back-tunneling voltage Vback2 is applied, is determined so that a greater number of electrons E than the number of holes in the edge area are tunneled. In this case, the holes H in the edge area are recombined with the injected electrons and neutralized, and thus additional electrons may be injected. Thus, the edge area is filled with a low concentration Low E of the electrons, and the memory cell MC is in a pre-program state. Thus, the storage node 33 includes a neutral area 33A, a positive area 335 in which holes H are filled, and a low negative area 33C which is filled with a low concentration of electrons E.

Also, in a structure of the memory cell MC, a peripheral area of the gate electrode 35 has electric field intensity greater than a central area thereof. Thus, a relatively great amount of electrons tunnel from the peripheral area of the gate electrode 35 to the storage node 33, and thus, an area of the storage node 33 corresponding to a periphery of the gate electrode 35 may have a greater number of electrons.

Figure 4C:
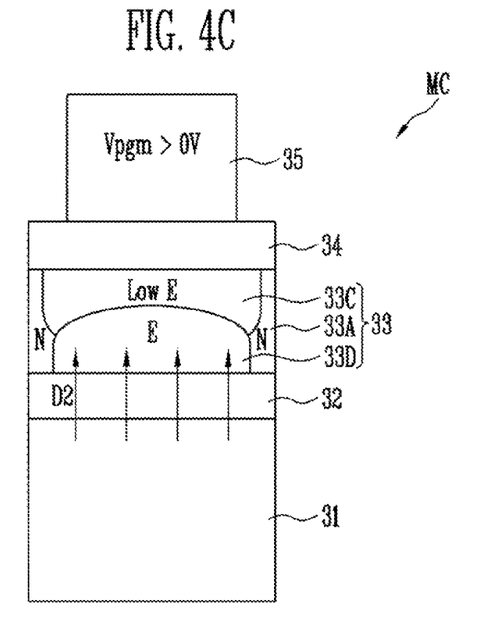
Figure 4D:
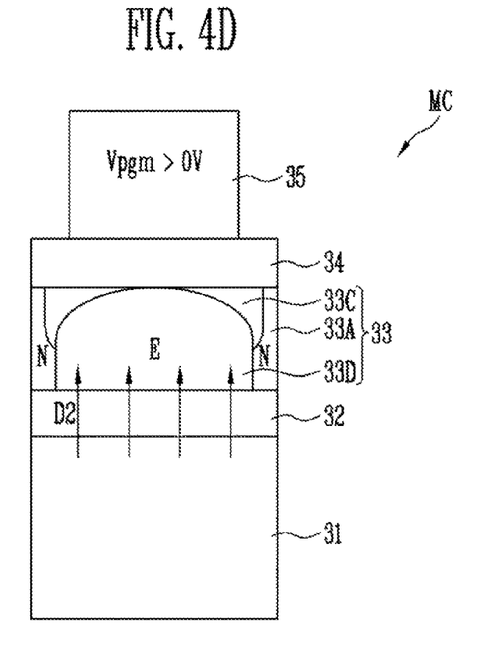

Referring to FIGS. 4C and 4D, electrons are injected to the storage node 33 of the selected memory cell MC from the channel layer 31. For example, the positive program voltage Vpgm, which has a gradually increasing level, is sequentially applied to the gate electrode 35 of the selected memory cell MC. In this case, since the electrons are injected in a second direction D2, an area of the storage node 33 adjacent to the channel layer 31 is gradually filled with electrons E. Thus, as the program voltage Vpgm is repeatedly applied, the edge area of the storage node 33, adjacent to the gate electrode G, is filled with the electrons E as well. Thus, the storage node 33 includes the neutral area 33A and a negative area 33D filled with the electrons E. Also, as the program operation repeated, the negative area 330 expands toward an edge area adjacent to the gate electrode 35.

According to the above-mentioned operating method, the program operation is bi-directionally performed based on the storage node 33. The electrons are injected into the storage node 33 in the first direction D1 using the second negative back-tunneling voltage Vback2, and then, the electrons are injected into the storage node 33 in the second direction D2 using the positive program voltage Vpgm. Thus, the edge area of the storage node 33 becomes a low negative area using the second back-tunneling voltage Vback2, and then, the program operation is performed, thereby improving data retention characteristics.

For reference, levels of back-tunneling voltages Vback1 and Vback2 or times T1 and T2 during which the back-tunneling voltage Vback1 and Vback2 are applied may be different based on whether the edge area of the storage node 33 is neutralized or filled with a low concentration of electrons. For example, the time T1 during which the first back-tunneling voltage Vback1 is applied may be the same as the time T2 during which the second back-tunneling voltage Vback2 is applied (i.e., T1=T2) and the second back-tunneling voltage Vback2 may have a value lower than the first back-tunneling voltage Vback1 (i.e., Vback2<Vback1<0). In another embodiment, the first back-tunneling voltage Vback1 and the second back-tunneling voltage Vback2 may have the same value (i.e., Vback1=Vback2<0), and the time T1 during which the second back-tunneling voltage Vback2 is applied may be longer than the time T1 during which the first back-tunneling voltage Vback1 is applied (i.e., T1<T2).

Figure 5:
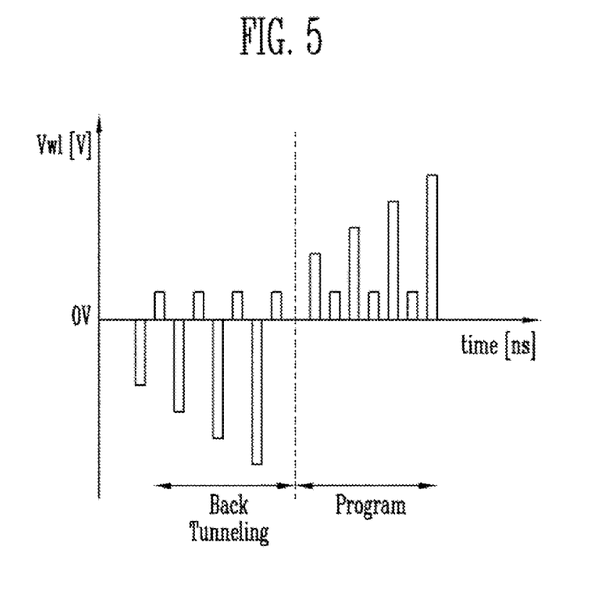
FIG. 5 is a view illustrating a method of operating a semiconductor device according to still another embodiment of the present invention.

FIG. 5 is a view illustrating a method of operating a semiconductor device according to still another embodiment of the present invention. The x-direction of the graph represents time (ns), and the y-direction represents a level V of a voltage applied to a word line WL.

Referring to FIG. 5, a negative back-tunneling voltage Vback which has a gradually decreasing level, and a verification voltage Vread having a fixed value are alternately applied when a back-tunneling operation is performed. Then, a positive program voltage Vpgm, which has a gradually increasing level, and a verification voltage Vread, having a fixed value, are alternately applied.

Figure 6:
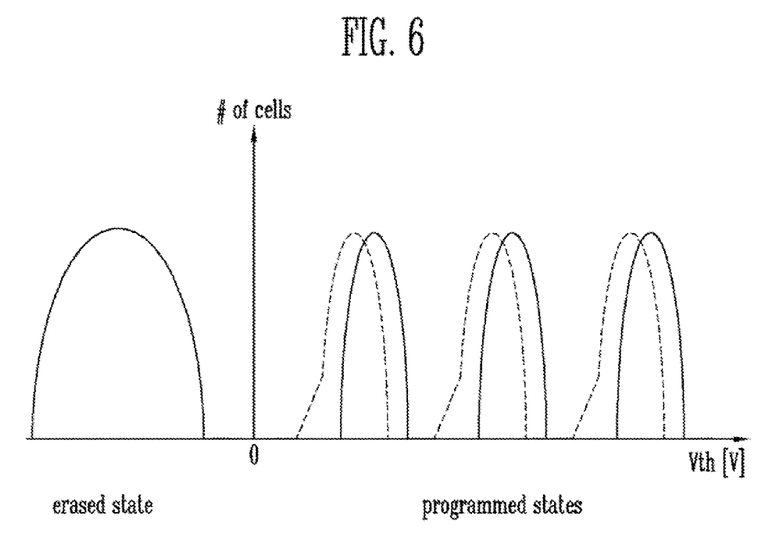
FIG. 6 is a view illustrating an effect of the method of operating the semiconductor device according to an embodiment of the present invention.

FIG. 6 is a view illustrating an effect of the method of operating the semiconductor device according to an embodiment of the present invention. The x-axis of the graph represents a threshold voltage Vth of the memory cells MC, and the y-axis represents the number of the memory cells MC having a corresponding threshold voltage Vth. Also, a solid line represents a threshold voltage distribution of the memory cells MC according to a bidirectional program operation including a back-tunneling operation, and a dashed line represents a threshold voltage distribution of the memory cells MC according to a conventional one direction program operation that does not include a back-tunneling operation.

Referring to FIG. 6, when a positive program voltage Vpgm is applied after the negative back-tunneling voltage Vback is applied, the threshold voltage distribution of the memory cells MC may narrow. Thus, retention characteristics of the semiconductor device may be improved.

Figure 7:
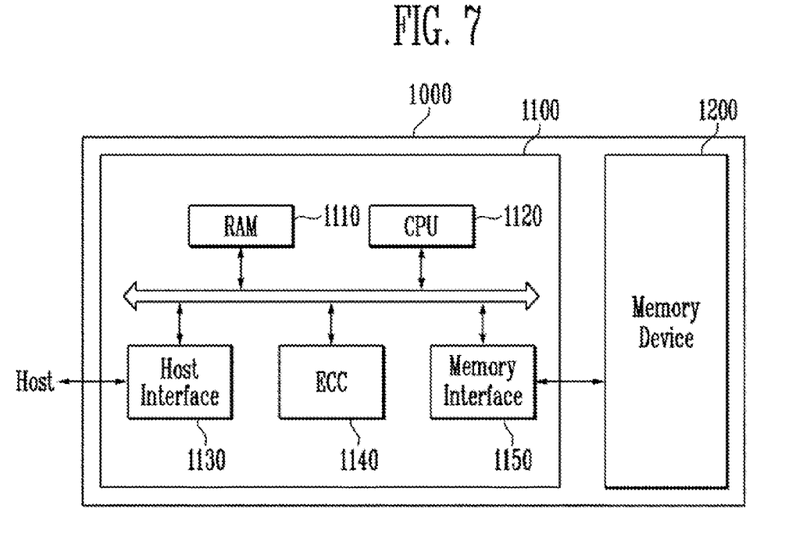
FIGS. 7 and 8 are block diagrams illustrating a configuration of a memory system according to an embodiment of the present invention.

FIG. 7 is a block diagram illustrating a configuration of a memory system according to an embodiment of the present invention.

Referring to FIG. 7, the memory system 1000 according to the embodiment of the present invention includes a memory device 1200 and a controller 1100.

The memory device 1200 is used to store data information having various data forms such as text, graphics, software codes, and/or the like. The memory device 1200 may be a nonvolatile memory, and include the structure described with reference to FIGS. 1 to 6. Also, the memory device 1200 includes a cell array including a plurality of memory cells, and at least one circuit configured to perform a program operation on the cell array. During a program operation of a selected memory cell, among the plurality of memory cells, the at least one circuit performs an erase operation on the plurality of memory cells, and applies a positive program voltage to a word line connected to the selected memory cell after a negative back-tunneling voltage is applied to the word line connected to the selected memory cell. The structure and the manufacturing method of the memory device 1200 are the same as described above, and thus, a detailed explanation is omitted.

The controller 1100 is connected to a host Host and the memory device 1200, and is configured to access the memory device 1200 in response to a request of the host Host. For example, the controller 1100 is configured to control read, write, erase, and background operations, and/or the like, of the memory device 1200.

The controller 1100 includes a random access memory (RAM) 1110, a central processing unit (CPU) 1120, a host interface 1130, and an error correction code (ECC) circuit 1140, a memory interface 1150, and/or the like.

Here, the RAM 1110 is configured to be used as an operational memory of the CPU 1120, a cache memory interposed between the memory device 1200 and the host Host, a buffer memory interposed between the memory device 1200 and the host Host, and/or the like. For reference, the RAM 1110 may be replaced by a static random access memory (SRAM), a read only memory (ROM), and/or the like.

The CPU 1120 is configured to control overall operations of the controller 1100. For example, the CPU 1120 may be configured to operate firmware such as a flash translation layer (FTL) stored in the RAM 1110, and/or the like.

The host interface 1130 is configured to interface with the host Host. For example, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The ECC circuit 1140 is configured to detect and correct an error included in data read from the memory device 1200 using an ECC.

The memory interface 1150 is configured to interface with the memory device 1200. For example, the memory interface 1150 includes a NAND interface or a NOR interface.

For reference, the controller 1100 may further include a buffer memory (not shown) that temporarily stores data. The buffer memory may be used to temporarily store data to be transmitted to the outside through the host interface 1130, or temporarily store data transmitted from the memory device 1200 through the memory interface 1150. Also, the controller 1100 may further include a ROM which stores code data for interfacing with the host Host.

As described in the above descriptions, the memory system 1000 according to the embodiment of the present invention includes the memory device 1200 which is easily manufactured and has a stable structure, and thus, characteristics of the memory system 1000 may also be improved.

Figure 8:
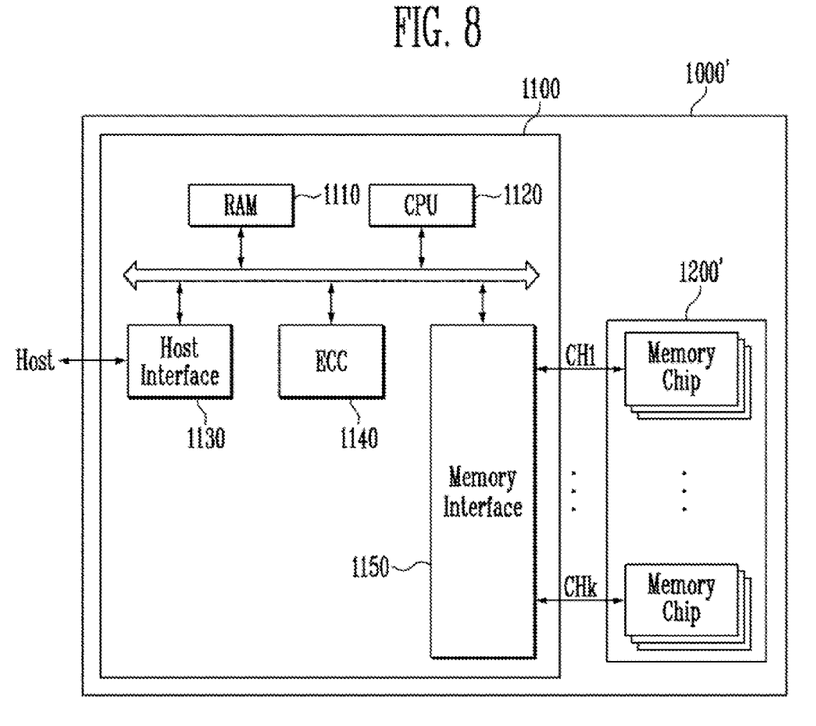

FIG. 8 is a block diagram illustrating a configuration of a memory system according to another embodiment of the present invention. Hereinafter, any repetitive explanations concerning the above-described content will be omitted.

Referring to FIG. 8, a memory system 1000 according to the embodiment of the present invention includes a memory device 1200' and a controller 1100. Also, the controller 1100 includes a RAM 1110, a CPU 1120, a host interface 1130, an ECC circuit 1140, a memory interface 1150, and/or the like.

The memory device 1200' may be a nonvolatile memory, and include the memory string described with reference to FIGS. 1 to 6. Also, the memory device 1200' includes a cell array including a plurality of memory cells, and at least one circuit configured to perform a program operation on the cell array. During a program operation of a selected memory cell among the plurality of memory cells, the at least one circuit performs an erase operation on the plurality of memory cells, and applies a positive program voltage to a word line connected to the selected memory cell after a negative back-tunneling voltage is applied to the word line connected to the selected memory cell. The structure and manufacturing method of the memory device 1200' are the same as described above, and thus, a detailed explanation will be omitted.

Also, the memory device 1200' may be a multi-chip package including a plurality of memory chips. The plurality of memory chips are divided into a plurality of groups, and the plurality of groups are configured to communicate with the controller 1100 through first to $k^{th}$ channels CH1 to CHk.

Also, memory chips included in one group are configured to communicate with the controller 1100 through a common channel. For reference, the memory system 1000' may be modified so that one memory chip is connected to one channel.

As described in the above descriptions, the memory system 1000' according to the embodiment of the present invention includes the memory device 1200' that is easily manufactured and has a stable structure, and thus, characteristics of the memory system 1000' may also be improved. In particular, since the memory device 1200' may constitute a multi-chip package, data storage capacity of the memory system 1000' may be increased, and driving speed thereof may be improved.

Figure 9:
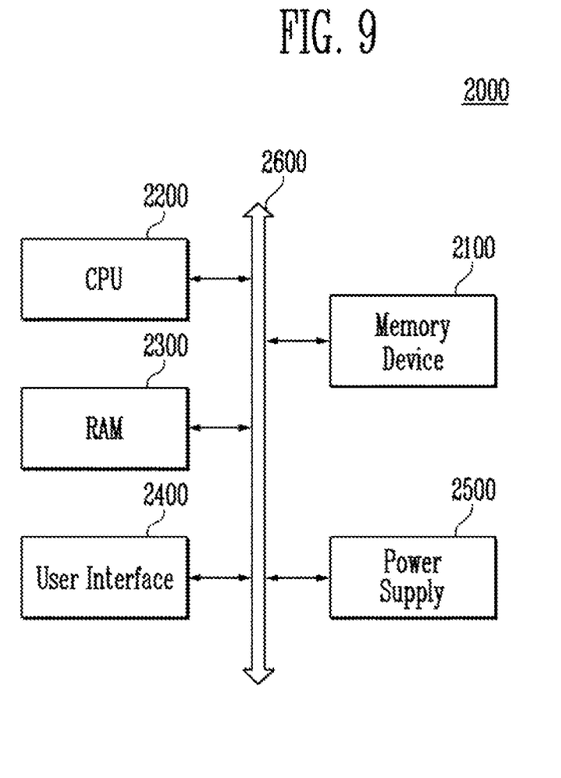
FIGS. 9 and 10 are block diagrams illustrating a configuration of a computing system according to an embodiment of the present invention.

FIG. 9 is a block diagram illustrating a configuration of a computing system according to an embodiment of the present invention. Hereinafter, any repetitive explanations concerning the above-described content will be omitted.

Referring to FIG. 9, a computing system 2000 according to the embodiment of the present Invention includes a memory device 2100, a CPU 2200, a RAM 2300, a user interface 2400, a power supply 2500, a system bus 2600, and/or the like.

The memory device 2100 stores data provided through the user interface 2400, data processed by the CPU 2200, and/or the like. Also, the memory device 2100 is electrically connected to the CPU 2200, the RAM 2300, the user interface 2400, the power supply 2500, and/or the like through the system bus 2600. For example, the memory device 2100 may be connected to the system bus 2600 through a controller (not shown), or directly connected to the system bus 2600. When the memory device 2100 is directly connected to the system bus 2600, the function of the controller may be performed by the CPU 2200, the RAM 2300, and/or the like.

Here, the memory device 2100 may be a nonvolatile memory, and may include the memory string described with reference to FIGS. 1 to 6. Also, the memory device 2100 includes a cell array including a plurality of memory cells, and at least one circuit configured to perform a program operation on the cell array. During a program operation of a selected memory cell, among the plurality of memory cells, the at least one circuit performs an erase operation on the plurality of memory cells, and applies a positive program voltage to a word line connected to the selected memory cell after a negative back-tunneling voltage is applied to the word line connected to the selected memory cell. A structure and a manufacturing method of the memory device 2100 are the same as described above and, thus, a detailed explanation will be omitted.

Also, the memory device 2100 may be the multi-chip package described in FIG. 8, which includes a plurality of memory chips.

The computing system 2000 having the aforementioned structure may be a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box a digital camera, a 3-dimensional television, a digital audio recorder, a digital audio player, a digital picture recorder, a digital picture player, a digital video recorder, a digital video player, a device which receives or transmits information in a wireless environment, one of various electronic devices included in a home network, one of various electronic devices included in a computer network, one of various electronic devices included in a telematics network, a radio-frequency identification (RFID) device, etc.

As described in the above descriptions, since the computing system 2000 according to an embodiment of the present invention includes the memory device 2100 having improved data reliability, data reliability of the computing system 2000 may also be improved.

Figure 10:
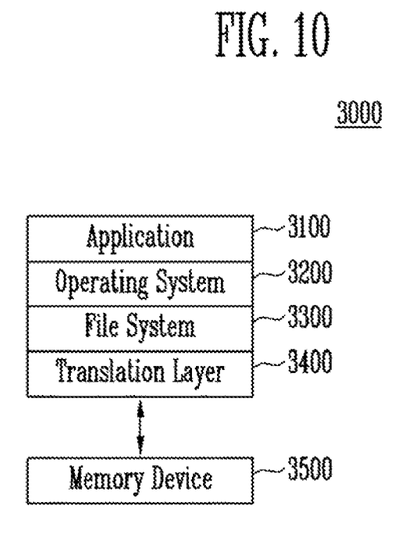

FIG. 10 is a block diagram illustrating a computing system according to another embodiment of the present invention.

Referring to FIG. 10, a computing system 3000 according to the embodiment of the present invention includes software layers, which include an operating system 3200, an application 3100, a file system 3300, a translation layer 3400, and/or the like. Also, the computing system 3000 includes hardware layers such as a memory device 3500, etc.

The operating system 3200 is configured to manage software, hardware resources, and/or the like, of the computing system 3000, and control program execution of a CPU. The application 3100 may be a utility executed by the operating system 3200 as various application programs which are executed in the computing system 3000.

The file system 3300 denotes a logic structure, which manages data, files, and/or the like, existing in the computing system 3000, and organizes data or files to be stored in the memory device 3500 based on rules. The file system 3300 may be determined based on the operating system 3200 used in the computing system 3000. For example, when the operating system 3200 is the Windows series of the Microsoft Corporation, the file system 3300 may be a file allocation table (FAT), an NT file system (NTFS), and/or the like. Also, when the operating system 3200 is the Unix/Linux series, the file system 3300 may be an extended file system (EXT), a Unix file system (UFS), a journal ng file system (JFS), and/or the like.

In the drawing, the operating system 3200, the application 3100, and the file system 3300 are described as individual blocks, however, the application 3100 and the file system 3300 may be included in the operating system 3200.

The translation layer 3400 may change an address into a suitable address type of the memory device 3500 in response to a request from the file system 3300. For example, the translation layer 3400 may change a logic address generated from the file system 3300 into a physical address of the memory device 3500. Here, mapping information of the logic address and the physical address may be stored in an address translation table. For example, the translation layer 3400 may be a flash translation layer (FTL), a universal flash storage link layer (ULL), and/or the like.

The memory device 3500 may be a nonvolatile memory, and include the memory string described with reference to FIGS. 1 to 6, as above explained. Also, the memory device 3500 includes a cell array including a plurality of memory cells, and at least one circuit configured to perform a program operation on the cell array. During a program operation of a selected memory cell, among the plurality of memory cells, the at least one circuit performs an erase operation on the plurality of memory cells, and applies a positive program voltage to a word line connected to the selected memory cell after a negative back-tunneling voltage is applied to the word line connected to the selected memory cell. The structure and manufacturing method of the memory device 3500 are the same as explained above, and thus, a detailed explanation will be omitted.

The computing system 3000 having the above-mentioned structure may be classified into an operating system layer performed in an upper level region and a controller layer performed in a lower level region. Here, the application 3100, the operating system 3200, and the file system 3300 may be included in the operating system layer, and may be operated by an operation memory of the computing system 3000. Also, the translation layer 3400 may be included in the operating system layer, or the controller layer.

As described in the above descriptions, since the computing system 3000 according to the embodiment of the present invention includes the memory device 3500 which is easily manufactured and has a stable structure, characteristics of the computing system 3000 may also be improved.

Since a positive program voltage is applied to a gate electrode of a selected memory cell after a negative back-tunneling voltage is applied thereto, a program operation is performed bi-directionally. Thus, the distribution of threshold voltages in memory cells may be improved, and data retention characteristics of a semiconductor device may be improved.

The present invention has been explained with reference to exemplary embodiments, however, it rill be apparent to those skilled in the art that various modifications can be made to the above-described exemplary embodiments of the present invention without departing from the spirit or scope of the invention. The essential technical scope of the present invention is disclosed in the appended claims, and it is intended that the present invention cover all such modifications provided they come within the scope of the claims and their equivalents.

What is claimed is:

1. A method of operating a semiconductor device, comprising:
   performing an erase operation on a plurality of memory cells;
   performing a back-tunneling operation by injecting electrons into a storage node from a gate electrode of a selected memory cell, which is selected from among the plurality of memory cells, wherein the electrons are injected into the gate electrode of the selected memory cell by applying a negative back-tunneling voltage; and
   performing a program operation by injecting electrons into the storage node from a channel layer of the selected memory cell.

2. The method of claim 1, wherein the performing of the back-tunneling operation further includes:
   alternately applying a verification voltage having a fixed value with the negative back-tunneling voltage,
   wherein the negative back tunneling voltage gradually decreases.

3. The method of claim 1, wherein the performing of the back-tunneling operation includes:
   removing holes in an edge area of the storage node adjacent to the gate electrode.

4. The method of claim 1, wherein the performing of the back-tunneling operation includes:
   neutralizing an edge area of the storage node adjacent to the gate electrode.

5. The method of claim 1, wherein the performing of the back-tunneling operation includes:
   filling an edge area of the storage node adjacent to the gate electrode with a low concentration of electrons.

6. The method of claim 1, wherein the performing of the program operation includes:
   alternately applying a positive program voltage, which gradually increases, and a verification voltage having a fixed value to the gate electrode of the selected memory cell.

7. The method of claim 1, wherein the storage node comprises nitride.

8. The method of claim 1, wherein the semiconductor device comprises:
   gate electrodes stacked on each other;
   a channel layer suitable for passing through the gate electrodes; and
   a storage node interposed between the gate electrodes and the channel layer.

9. A method of performing a bidirectional program operation on a semiconductor device, comprising:
   performing an erase operation on a plurality of memory cells;
   applying a negative back-tunneling voltage to a word line connected to a selected memory cell, which is selected from the plurality of memory cells; and
   applying a positive program voltage to the word line connected to the selected memory cell.

10. The method of claim 9, wherein the applying of the negative back-tunneling voltage includes:
   alternately applying a verification voltage having a fixed value with the negative back-tunneling voltage to the word line,
   wherein the negative back-tunneling voltage gradually decreases.

11. A semiconductor device comprising:
   a cell array including a plurality of memory cells; and
   a control circuit suitable for performing a program operation on the cell array,
   wherein the control circuit performs the program operation on a selected memory cell that is selected from the plurality of memory cells by applying a negative back-tunneling voltage to a word line connected to the selected memory cell and applying a positive program voltage to the word line, after performing an erase operation on the plurality of memory cells.

12. The semiconductor device of claim 11, wherein the control circuit alternately applies the negative back-tunneling voltage, which has a gradually decreasing level, and a verification voltage having a fixed value to the word line.

* * * * *